United States Patent
Heqing Sun et al.

(10) Patent No.: US 10,319,156 B2
(45) Date of Patent: Jun. 11, 2019

(54) METHOD AND SYSTEM FOR DETECTING A CONDITION OF AN ELECTRIC MACHINE

(71) Applicant: ABB Schweiz AG, Baden (CH)

(72) Inventors: Amandine Heqing Sun, Shanghai (CN); Maciej Orman, Shanghai (CN); Cajetan Pinto, Mumbai (IN)

(73) Assignee: ABB Schweiz AG, Baden (CH)

( * ) Notice: Subject to any disclaimer, the term of this patent is extended or adjusted under 35 U.S.C. 154(b) by 173 days.

(21) Appl. No.: 15/350,039

(22) Filed: Nov. 12, 2016

(65) Prior Publication Data
US 2017/0140579 A1 May 18, 2017

(30) Foreign Application Priority Data
Nov. 13, 2015 (CN) .......................... 2015 1 0874302

(51) Int. Cl.
*G01R 31/34* (2006.01)
*G07C 3/14* (2006.01)

(52) U.S. Cl.
CPC .............. *G07C 3/14* (2013.01); *G01R 31/343* (2013.01)

(58) Field of Classification Search
CPC ........ G07C 3/14; G01R 31/34; G01R 31/343; G01R 31/346; G01R 33/02
See application file for complete search history.

(56) References Cited

U.S. PATENT DOCUMENTS 6,064,172 A * 5/2000 Kuznetsov ........... G01R 31/346 318/434
2009/0243647 A1* 10/2009 Chari .................. G01R 31/343 324/765.01

FOREIGN PATENT DOCUMENTS

| DE | 102009003678 A1 | 10/2009 |
|---|---|---|
| EP | 2541217 A1 | 1/2013 |
| EP | 2942633 A1 | 11/2015 |
| WO | 2015101422 A1 | 7/2015 |
| WO | 2015173662 A2 | 11/2015 |

OTHER PUBLICATIONS

Extended European Search Report, European Application No. 16158781.1-1568, dated Sep. 21, 2014, 12 pages.
Romary et al., "Electrical machines fault diagnostics by stray flux analysis", Electrical Machines Design Control and Diagnosis (WEMDCD), 2013 IEEE Workshop, Mar. 11, 2013, pp. 247-256.

\* cited by examiner

*Primary Examiner* — Manuel L Barbee
(74) *Attorney, Agent, or Firm* — Barnes & Thornburg LLP

(57) ABSTRACT

In aspects, the present invention discloses a method of detecting a condition of an electric machine using a portable diagnostic device comprising one or more sensors for measuring at least one physical parameter associated with the electric machine in at least two axes. The method comprises measuring the at least one physical parameter associated with electric machine at a first position in a first axis and a second axis, determining a ratio of a first measurement of the at least one physical parameter in the first axis and a second measurement of the at least one physical parameter in the second axis at the first position, identifying a spatial distribution associated with the condition of the electric machine from a database based on the determined ratio and identifying the condition of the electric machine based on the identified spatial distribution.

7 Claims, 5 Drawing Sheets

METHOD AND SYSTEM FOR DETECTING A CONDITION OF AN ELECTRIC MACHINE

CROSS-REFERENCE TO RELATED APPLICATION

This application claims priority under 35 U.S.C. § 119 to Chinese Patent Application No. 201510874302.6, filed on Nov. 13, 2015, the entire disclosure of which is expressly incorporated by reference herein.

TECHNICAL FIELD

The current invention relates to the field of condition monitoring of electric machine, and more particularly, the current invention relates to detection and determination of faults in an electric machine using spatial distribution of one or more physical parameters associated with the electric machine.

BACKGROUND

Monitoring of health and subsequent diagnosis of a fault in an electric machine such as a motor, can be done using a plurality of techniques known in the state of the art. In one such technique, a visual representation of one or more parameters such as temperature, magnetic field, etc., around the space of the motor is created by collecting measurements of the parameters around the motor. For example a three dimensional heat map can be drawn in the space around the motor indicating the strength of magnetic field around the motor. Based on the three dimensional heat map, a service engineer can make estimate guesses regarding the health of the motor and the potential faults in the motor, if any.

Conventionally, the three dimensional visual representation is generated based on an extensive scan of the space around the motor using one or more sensors. A multiplicity of points are scanned repeatedly, and based on the measurements taken from the multiplicity of points the three dimensional visual representation is generated. However, for the complicated electrical motors, this convention approach is often time consuming and ineffective. In order to ensure that a relatively accurate three dimension visual representation can be generation, the scan has to be performed over a large area around the motor which can be tedious, difficult to achieve, and time consuming. If the scan is not performed over a large enough area or if the scanned area is not chosen properly, the main features of the electrical motors or systems will not be captured in the three dimensional visual representation.

Therefore, in light of the above discussion, there is a need for a system and method that solves the problems mentioned above.

SUMMARY

The above-mentioned shortcomings, disadvantages and problems are addressed herein which will be understood by reading and understanding the following specification.

In one aspect, the present invention provides a method of detecting a condition of an electric machine using a portable diagnostic device. The portable diagnostic device 120 includes one or more sensors for measuring at least one physical parameter associated with the electric machine in at least two axes.

The method comprising measuring the at least one physical parameter associated with electric machine at a first position in a first axis and a second axis, determining a ratio of a first measurement of the at least one physical parameter in the first axis and a second measurement of the at least one physical parameter in the second axis at the first position, identifying a spatial distribution associated with the condition of the electric machine from the one or more spatial distributions stored on a database, based on the determined first ratio, and identifying the condition of the electric machine based on the identified spatial distribution. The first axis is at a first angle to an axis of the electric machine and the second axis is at a second angle to the axis of the electric machine.

In an embodiment, identifying the condition of the electric machine includes identifying one or more anomalous regions in the spatial distribution of the at least one physical parameter for detecting the fault in the electric machine. The one or more sensors include a temperature sensor, a magnetometer, and an acoustic sensor.

In an embodiment, the first position is substantially close to a drive side bearing of the electric machine. In an embodiment, the first axis is substantially perpendicular to the second axis. In an embodiment, the method further comprises measuring the at least one physical parameter associated with electric machine in a third axis and one of the first axis and the second axis at the second position. The method further comprises determining a second ratio of a first measurement of the physical parameter in the third axis and a second measurement of the physical parameter in one of the first axis and second axis, at second position. The spatial distribution from the one or more spatial distributions, associated with the condition of the electric machine from a database is identified based on the determined first ratio and the second ratio.

In another aspect, the present invention discloses a system for detecting a condition of an electric machine. The system comprises a database configured to store one or more spatial distributions associated with electric machine and a portable diagnostic device. The portable diagnostic device comprises one or more sensors for measuring at least one physical parameter associated with the electric machine in at least two axes, a network interface configured to communicate with the database, one or more processors configured to measure at least one physical parameter associated with electric machine in a first axis and a second axis at a first position, determine a first ratio of a first measurement of the physical parameter in the first axis and a second measurement of the physical parameter in the second axis at the first position, retrieve the one or more spatial distributions associated with the electric machine from the database, identify a spatial distribution from the one or more spatial distributions based on the determined first ratio, and identify the condition of electric machine based on the spatial distribution; and a memory module operatively coupled to the one or more processors. The portable diagnostic device further includes means for determining an orientation of the portable diagnostic device.

Systems and methods of varying scope are described herein. In addition to the aspects and advantages described in this summary, further aspects and advantages will become apparent by reference to the drawings and with reference to the detailed description that follows.

BRIEF DESCRIPTION OF THE DRAWINGS

The subject matter of the invention will be explained in more detail in the following text with reference to preferred exemplary embodiments which are illustrated in the drawings, in which.

DETAILED DESCRIPTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Figure 1:
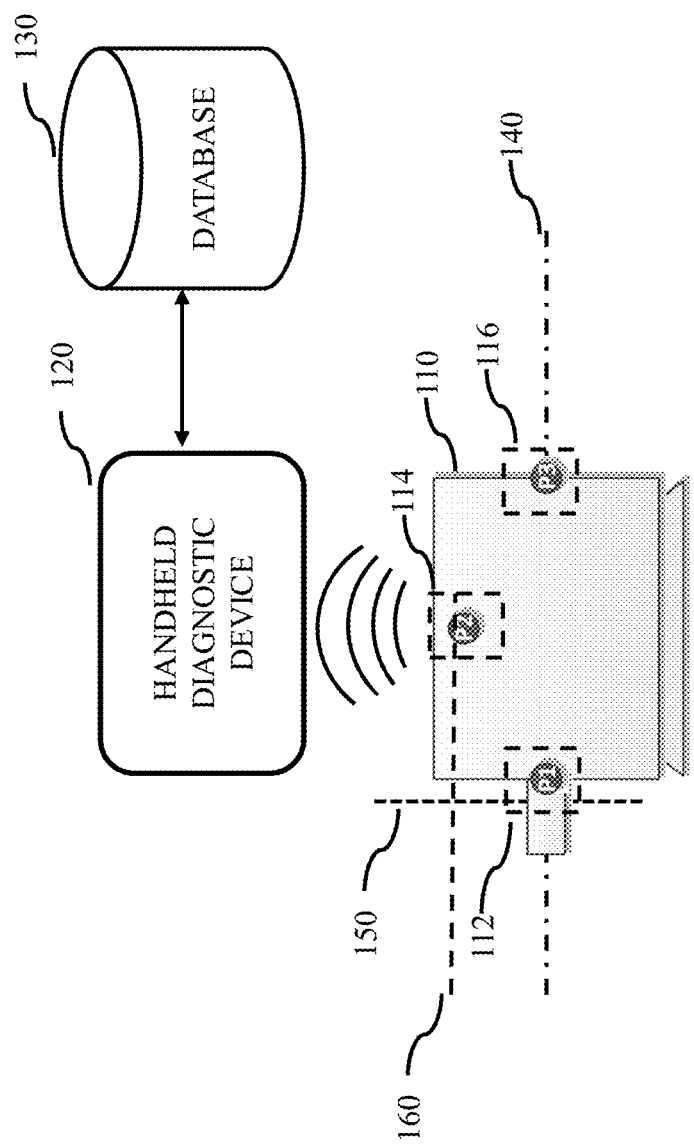
FIG. 1 illustrates a system for detecting a condition of an electric machine, in accordance with various embodiments of the present invention.
Figure 5B:
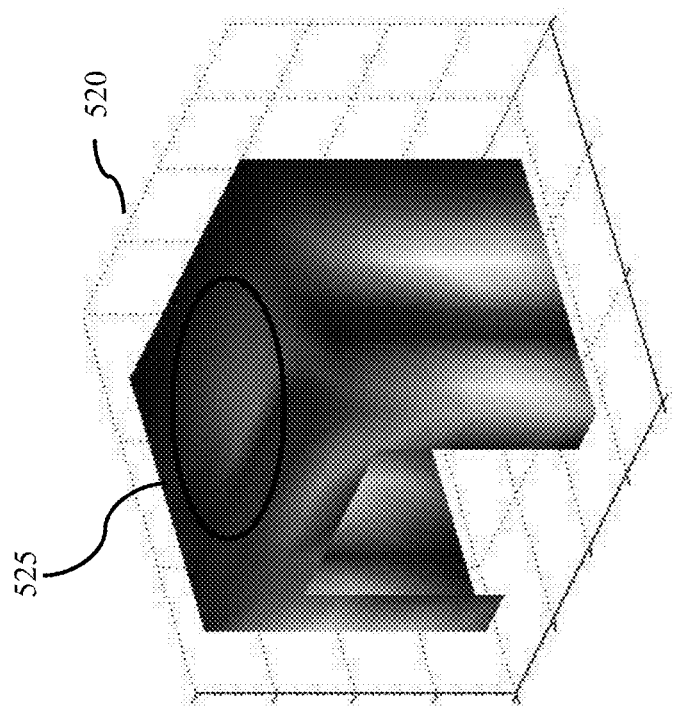
FIG. 5B illustrates a view of spatial magnetic maps of a motor with asymmetry in rotor bar, in accordance with various embodiments of the present invention.
Figure 5A:
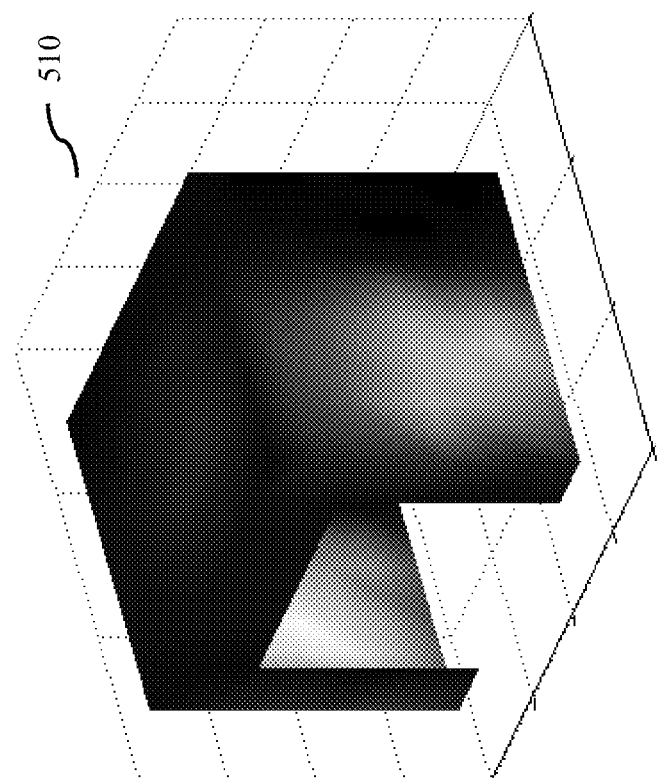
FIG. 5A illustrates a view of spatial magnetic maps of a healthy motor, in accordance with various embodiments of the present invention.

FIG. 1 illustrates a system 100 for detecting a condition of an electric machine 110, in accordance with various embodiments of the present invention. The system includes a portable diagnostic device 120 communicatively coupled to a database 130 over a known communication network. The database stores a plurality of spatial distributions associated with electric machine 110. Spatial distribution (also known as spatial data map) herein refers to a collection or an array of measurements of one or more physical parameters along with information regarding points of measurements about the electric machine 120 where the measurements were taken. A visual representation of a spatial distribution is provided in FIGS. 5A-B. The plurality of spatial distributions stored in the database 130 are associated with one or more conditions of the electric machine 110. In an embodiment, one or more spatial distributions from the plurality of spatial distributions are associated with a normal condition wherein the electric machine 110 is working within the normal operating situation. Similarly, the remaining spatial distributions are associated with various faults that can be experienced by the electric machine 110. For example, the visual representation 510 is a spatial representation of a healthy motor illustrated in FIG. 5A. Similarly, the visual representation 520 is a spatial representation of a motor with asymmetry in rotor bar illustrated in FIG. 5B. This is particularly observed from the visual representation 420 due to the presence of anomalous regions in the section 525 of the spatial distribution.

In an embodiment, the database 130 is populated with the plurality of spatial distributions by systematically scanning, measuring and collecting various physical parameters at a multiplicity of points in various planes and axes around various electric machines in different conditions. The plurality of spatial distributions is stored in the database 130 along with the information regarding the condition and faults of the scanned electric machine.

The portable diagnostic device 120 includes a network interface configured to communicate with the database 130 for retrieving one or more spatial distributions associated with the electric machines 110. Additionally, the portable diagnostic device 120 comprises one or more sensors for measuring at least one physical parameter associated with the electric machine 110 in at least two axes (150, 160). In an embodiment, the one or more sensors include a temperature sensor, a magnetometer, an acoustic sensor, and the like. The sensors are configured to measure the corresponding physical parameter along two or more axes. In an example, the magnetometer is a triaxial sensor capable of measuring magnetic leakage flux around the machine 110 in three axes.

Further, the portable diagnostic device 110 includes one or more processors which are configured to utilize the one or more sensors to measure the at least one physical parameter associated with electric machine 110 in a first axis 150 and a second axis 160 at a first position 112. Using the sensors, the processors obtain a first measurement of the at least one physical parameter in the first axis 150 and a second measurement of the at least one physical parameter in the second axis 160 at the first position 112. Then, the processors determine a first ratio of a first measurement of the physical parameter in the first axis 150 and a second measurement of the physical parameter in the second axis 160 at the first position 112. Through the network interface the processors retrieve the one or more spatial distributions associated with the electric machine 110 from the database 130 and accordingly identify a spatial distribution from the one or more spatial distributions based on the determined first ratio. Based on the identified spatial distribution, the processors assess or determine the condition of the electric machine 110.

A memory module is operatively coupled to the one or more processors and is utilized in the operations performed by the one or more processors. In an embodiment, the portable diagnostic device 120 includes a means for detecting an orientation of the portable diagnostic device 120. In an embodiment, an electronic equivalent of a gyroscope conventionally known is utilized. The orientation detection means is utilized to ensure that measurements are always taken along the same axes in multiple points. Aspects in relation to detection of the condition of the electric machine is further explained in the description of FIG. 2.

Figure 2:
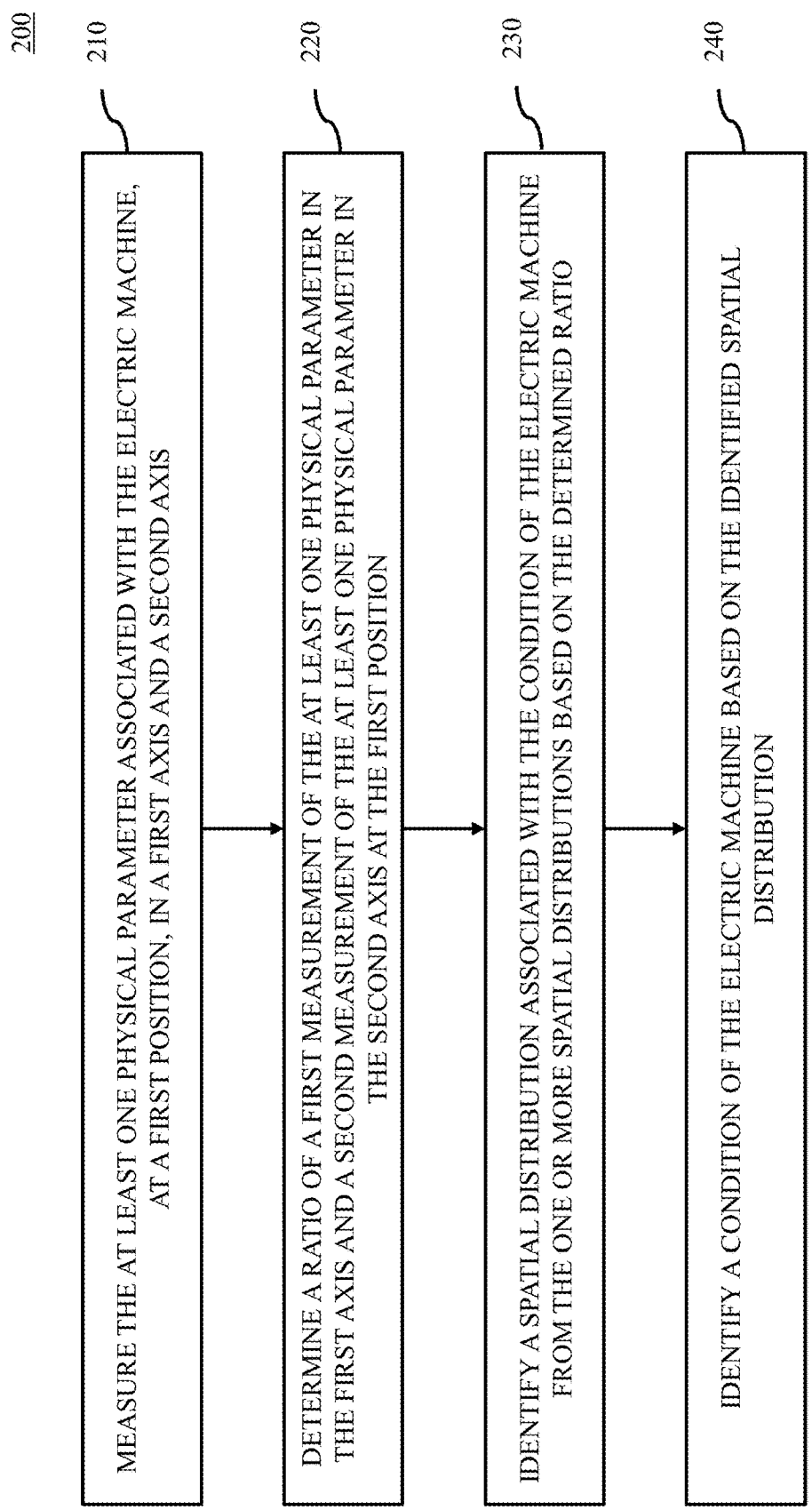
FIG. 2 illustrates a method for detecting a condition of an electric machine, in accordance with various embodiments of the present invention.

FIG. 2 illustrates a method 200 for detecting a condition of an electric machine 110, in accordance with various embodiments of the present invention. At step 210, the portable diagnostic device 120 measures the at least one physical parameter associated with the electric machine 110, at the first position 112, in the first axis 150 and the second axis 160 of the at least two axes (150, 160). The portable diagnostic device 120 obtains a first measurement of the at least on physical parameter in the first axis 150 and a second measurement of the at least one physical parameter in the second axis 160 at the first position 1120. The first axis 150 is at a first angle to an axis 140 of the electric machine 110 and the second axis 160 is at a second angle to the axis 140 of the electric machine 110.

Figure 3B:
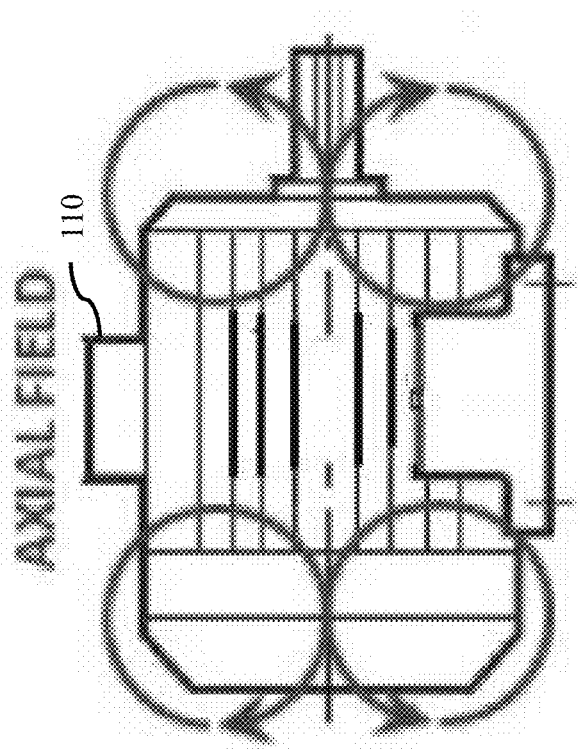
FIG. 3B illustrates a sectional view of an axial magnetic field, in accordance with various embodiments of the present invention.
Figure 3A:
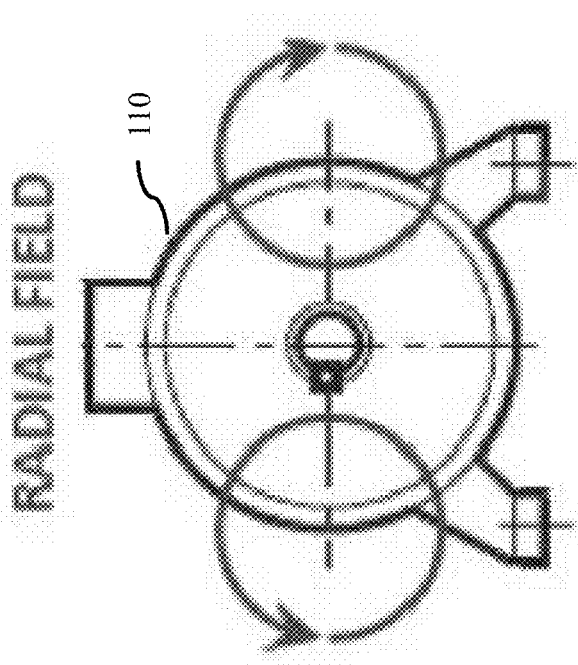
FIG. 3A illustrates a sectional view of a radial magnetic field around a motor, in accordance with various embodiments of the present invention.

In an example, the at least one physical parameter is the magnetic leakage flux measured at a drive side bearing (first position 112) of the electric machine 110. Particularly, the first measurement of the leakage flux is obtained in the radial magnetic field about the first axis 150 and the second measurement of the leakage flux is obtained in the axial magnetic field about the second axis 160. The radial and axial magnetic fields are illustrated in FIGS. 3A and 3B, respectively. The first axis 150 is substantially parallel to the axis of the rotor of the electric machine 110 and the second axis 160 is perpendicular to the first axis 150 and the axis of the rotor of the electric machine 110.

Figure 4:
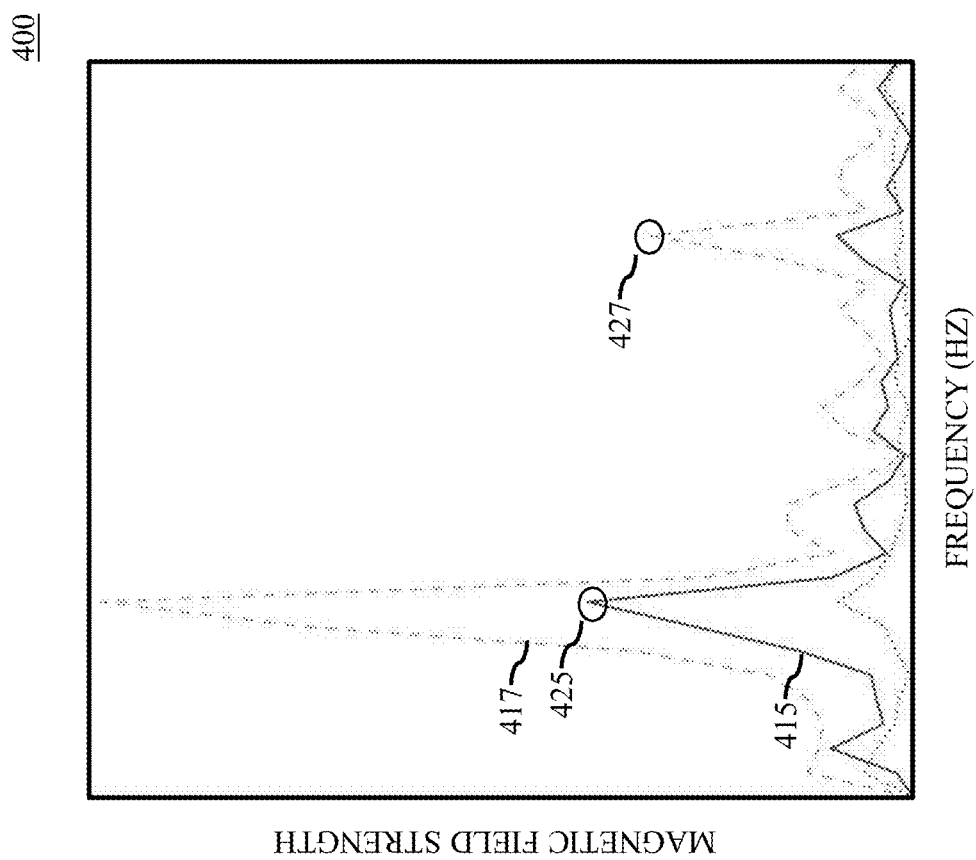
FIG. 4 illustrates a frequency spectrum of magnetic leakage flux, in accordance with various embodiments of the present invention.

At step 220, the portable diagnostic device 120 determines a first ratio of a first measurement of the at least one physical parameter in the first axis 150 and a second measurement of the at least one physical parameter in the second axis 160 at the first position 112. In an embodiment, the first measurement is measurement of amplitude of frequencies in the first axis 150 and the second measurement is measurement of amplitude of frequencies in the second axis 160. For example, an exemplary spectrum 400 is illustrated in FIG. 4. The first measurement is indicated using a solid line 415 and the second measurement is indicated using a line 417 with dashed in the FIG. 4.

In an embodiment, the determined first ratio is the ratio of amplitude of line frequency (i.e. 50 hertz) in the first measurement (highlighted in the FIG. 4 using circle 425) and amplitude of the third harmonic of the line frequency (highlighted in FIG. 4 using circle 427). In another embodiment, a first average value is calculated from each amplitude value of a corresponding frequency in a certain frequency band is measured in the first axis 150. Similarly, a second average value is calculated from each amplitude value of a corresponding frequency in a certain frequency band is measured in the second axis. The determined first ratio is a ratio of the first and second average values.

At step 230, the portable diagnostic device 120 identifies a spatial distribution associated with the condition of the electric machine 110 from the one or more spatial distributions stored on a database 130, based on the determined first ratio. In an embodiment, the portable diagnostic device 120 utilizes the value of the determined first ratio to identify a spatial distribution which exhibits a similar (i.e. within a predetermined threshold) or same value for the ratio. Continuing the above mentioned example, the printable diagnostic device calculates one or more ratios of amplitude of the line frequency in the first axis 150 and the amplitude of the third harmonic of the line frequency in the second axis from the one or more spatial distributions associated with the electric machine 110. Based on the ratios associated with each spatial distribution and the determined first ratio, the portable diagnostic device 120 identifies a spatial distribution which has a ratio similar to the determined first ratio.

In an embodiment, when one than more spatial distributions have ratios similar to the determined first ratio, the first measurement and the second measurement can be utilized by the portable diagnostic device 120 in identifying the appropriate spatial distribution based on correlation. For example, root mean square of the difference in ratios of the spectrum of the first measurement in the first and second, and spectrum of the respective spatial distribution in the first and second axis and 150 can be calculated. The spatial distribution having the least root mean square value can identified as the appropriate spatial distribution.

At step 230, the portable diagnostic device 120 identifies the condition of the electric machine 110 based on the identified spatial distribution. As mentioned previously, the spatial distributions are associated with one or more conditions with the electric machine 110. The portable diagnostic device 120 is configured to look up the condition associated the spatial distribution identified from the database 130. In an embodiment, the portable diagnostic device 120 is configured to perform spatial analysis using a plurality of techniques conventionally known, to determine a condition of the electric machine based on the identified spatial distribution and the condition associated with it. For example, when an identified spatial distribution is associated with a condition of asymmetry in the rotor, the portable diagnostic device 120 looks up the condition from the database 130 and determines the electric machine 110 is suffering from asymmetry in the rotor bar.

In an embodiment, the portable diagnostic device 120 is configured to adapt the identified spatial distribution using the first measurement and the second measurement. In an embodiment, the portable diagnostic device 120 transmits the information regarding the identified spatial distribution and the first and second measurements to a server (not shown in figures). The server, on the basis of the first and second measurement, can modify or adjust the identified spatial distribution to fit the electric machine 110 properly using a plurality of conventional known statistical methods. In another embodiment, the portable diagnostic device 120 along with the server, can utilize the modified spatial distribution and the one or more spatial distributions and the associated conditions to perform spatial analysis and identify the condition associated with the electric machine 110. In an embodiment, the portable diagnostic device 120, along with the server, identifies one or more anomalous regions in the spatial distribution of the at least one physical parameter for detecting the fault in the electric machine 110. Anomalous region herein refers to either a cluster of points in the spatial distribution which do not fit into an overall profile of the neighboring cluster of points in the spatial distribution, or one or more clusters of points which are absent in a spatial distribution associated with a normal condition of the electric machine 110. Based on the one or more anomalous regions identified, the portable diagnostic device can determine the nature of the fault and the location of the fault in the electric machine 110. For example, based on a spatial distribution of sound level having an anomalous region (i.e. a plurality of points with amplitude greater than a mean of the amplitude of the spatial distribution) around one particular bearing side, the portable diagnostic device 120 can determine a bearing fault at that particular bearing side.

While the current method has been explained using measurements at the first position and at least one parameter, it is to be noted by a person skilled in the art that the method can be extended to include one or more positions, such as position 114 and 116, and plurality of physical parameters. Such extension to utilize two or more points along with two or more physical parameters would help in identifying the spatial distribution and in modifying the spatial distribution.

For example, in an embodiment, the portable diagnostic device measures the at least one physical parameter associated with electric machine 110 in a third axis (not shown in figure) and the second axis 160 at the second position 114. The second position 114 lies on the second axis 160 and the third axis. The third axis is parallel to the first axis 150 and is displaced from the first axis towards the electric machine 110. Similarly, in addition to the determined first ratio, the portable diagnostic device determines a second ratio of a first measurement of the physical parameter in the third axis and a second measurement of the physical parameter in one of the first axis 150 and second axis 160, at second position 114. The portable diagnostic device utilizes the determined first ratio and the second ratio in identifying a spatial distribution from the one or more spatial distributions using the step mentioned previously. Similarly, the method can be extended to a third position 116.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method of detecting a condition of an electric machine using a portable diagnostic device, wherein the portable diagnostic device includes one or more sensors for measuring at least one physical parameter associated with the electric machine in at least two axes, the method comprising:
   measuring the at least one physical parameter associated with the electric machine, at a first position, along a first axis and a second axis of the at least two axes, wherein the first axis is at a first angle to an axis of the electric machine and the second axis is at a second angle to the axis of the electric machine, wherein the second angle is distinct from the first angle;
   determining a first ratio of a first measurement of the at least one physical parameter in the first axis and a second measurement of the at least one physical parameter in the second axis at the first position;
   identifying a spatial distribution from one or more spatial distributions associated with one or more conditions of the electric machine stored on a database, based on the determined first ratio, wherein each spatial distribution from the one or more spatial distributions is associated with one of a normal condition and a plurality of fault conditions, and includes an array of measurements of one or more parameters and corresponding information regarding points of measurement about the electric machine; and
   identifying the condition of the electric machine based on the identified spatial distribution, wherein identifying the condition of the electric machine further comprises:
      adapting the identified spatial distribution for the electric machine using the first measurement and second measurement, and
      determining one or more anomalous regions in the modified spatial distribution, wherein each anomalous region includes a cluster of proximal measurements in the modified spatial distribution;
   wherein the one or more spatial distributions are populated and stored on the database by plurality of spatial distributions measuring a plurality of physical parameters at a multiplicity of points in one or more planes and axes around one or more electric machines.

2. The method as claimed in claim 1, wherein identifying the condition of the electric machine includes identifying one or more anomalous regions in the spatial distribution of the at least one physical parameter for detecting the fault in the electric machine.

3. The method as claimed in claim 1, wherein the one or more sensors include a temperature sensor, a magnetometer, and an acoustic sensor.

4. The method as claimed in claim 1, wherein the first position is substantially close to a drive side bearing of the electric machine, and wherein the first axis is substantially perpendicular to the second axis.

5. The method as claimed in claim 1, further comprising measuring the at least one physical parameter associated with electric machine in a third axis and one of the first axis and the second axis at the second position.

6. The method as claimed in claim 5, further comprising determining a second ratio of a first measurement of the physical parameter in the third axis and a second measurement of the physical parameter in one of the first axis and second axis at second position, wherein identifying the spatial distribution from the one or more spatial distributions associated with the one or more conditions of the electric machine from the database is based on the determined first ratio and the second ratio.

7. A system for detecting a condition of an electric machine, the system comprising:
   a database configured to store one or more spatial distributions associated with the electric machine; and
   a portable diagnostic device, comprising:
      one or more sensors for measuring at least one physical parameter associated with the electric machine in at least two axes;
      a means for determining an orientation of the portable diagnostic device;
      a network interface configured to communicate with the database;
      a memory module; and
      one or more processors operatively coupled to the memory module and configured to:
         measure at least one physical parameter associated with electric machine in a first axis and a second axis at a first position;
         determine a first ratio of a first measurement of the physical parameter in the first axis and a second measurement of the physical parameter in the second axis at the first position;
         retrieve the one or more spatial distributions associated with the electric machine from the database;
         identify a spatial distribution from the one or more spatial distributions based on the determined first ratio; and
         identify the condition of the electric machine based on the spatial distribution.

* * * * *